(12) United States Patent
Oh et al.

(10) Patent No.: US 7,946,669 B2
(45) Date of Patent: May 24, 2011

(54) ALIGNING APPARATUS

(75) Inventors: Jong-han Oh, Yongin-si (KR);
Seung-hwang Yi, Suwon-si (KR);
Dong-eog Kim, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 1396 days.

(21) Appl. No.: 11/206,037

(22) Filed: Aug. 18, 2005

(65) Prior Publication Data

US 2006/0039735 A1    Feb. 23, 2006

(30) Foreign Application Priority Data

Aug. 19, 2004    (KR) .......................... 10-2004-0065573

(51) Int. Cl.
*B41J 25/308*    (2006.01)
*B41J 29/393*    (2006.01)
*B41J 23/00*    (2006.01)
(52) U.S. Cl. .................. 347/8; 347/19; 347/37
(58) Field of Classification Search .................. 347/5, 8, 347/16, 19, 37, 101
See application file for complete search history.

(56) References Cited

U.S. PATENT DOCUMENTS

| 2003/0189604 A1 * | 10/2003 | Bae et al. | ........................... 347/2 |
| 2003/0189606 A1 * | 10/2003 | Moon et al. | ........................ 347/2 |

FOREIGN PATENT DOCUMENTS

| EP | 0977285 A1 | 7/1999 |
| JP | 07-208925 | 8/1995 |
| JP | 09-323056 | 12/1997 |
| JP | 2002-221616 | 8/2002 |
| JP | 2003-165080 | 6/2003 |
| JP | 2004-022949 | 1/2004 |
| KR | 1999-0015212 | 2/2001 |
| KR | 2003-80378 | 10/2003 |
| KR | 2003-80380 | 6/2004 |

OTHER PUBLICATIONS

Japanese Office Action dated Dec. 11, 2007 issued in JP 2005-229734.
Japanese Office Action issued Sep. 30, 2008 in JP 2005-229734.
Korean Office Action dated Jun. 27, 2006 issued in KR 2004-65573.

* cited by examiner

*Primary Examiner* — Matthew Luu
*Assistant Examiner* — Jannelle M Lebron
(74) *Attorney, Agent, or Firm* — Stanzione & Kim, LLP

(57) ABSTRACT

An apparatus to align a substrate and a print head having a plurality of orifices so as to perform a printing operation by ejecting ink on the substrate comprises a camera unit provided between the substrate and the print head to photograph the plurality of orifices of the print head and the substrate so as to align the print head and the substrate, and a camera moving part to movably support the camera unit and to move the camera unit between the substrate and the print head. Thus, the aligning apparatus has a simple configuration that may be easily installed and may be controlled precisely. The aligning apparatus may also be used with opaque substrates.

35 Claims, 4 Drawing Sheets

ALIGNING APPARATUS

CROSS-REFERENCE TO RELATED APPLICATIONS

This application claims the benefit of Korean Patent Application No. 2004-65573, filed on Aug. 19, 2004, in the Korean Intellectual Property Office, the disclosure of which is incorporated herein in its entirety by reference.

BACKGROUND OF THE INVENTION

1. Field of the Invention

The present general inventive concept relates to an aligning apparatus, and more particularly to, an aligning apparatus to align a substrate and a print head so that the print head can perform a printing operation on the substrate.

2. Description of the Related Art

Generally, display panels to display images are formed on flat display apparatuses such as thin film transistor-liquid crystal displays (TFT-LCD) and organic electro luminescence displays (ELD).

A process of manufacturing a display panel includes a printing process to form a color filter on a display panel substrate. Inkjet printing devices have been widely used to perform this printing process.

An inkjet printing device includes a print head having a plurality of orifices. The print head ejects ink for the color filter from the orifices onto the display panel substrate. The ink is then cured on a plurality of pixels formed on the display panel substrate. Using the inkjet printing device to perform this printing process is advantageous, since the inkjet printing device is less expensive and simpler than conventional photolithography devices.

The inkjet printing device is typically used with an aligning apparatus to align the print head with the display panel substrate so as to allow ink to be ejected onto the pixels of the display panel substrate or an inspecting apparatus to inspect whether the ink is properly positioned on the pixels of the display panel substrate in order to aid in the printing process.

The aligning apparatus aligns the print head and the pixels of the display panel substrate before the print head ejects the ink onto the pixels of the display panel substrate. As a result, cost can be decreased by reducing the manufacturing processes, since it becomes unnecessary to inspect the positions of the ink after the ink is ejected onto the display panel substrate.

A conventional inkjet aligning apparatus to manufacture this kind of display panel is disclosed in Korean Patent Application No. 10-2002-0018970. The conventional aligning apparatus for manufacturing the display panel comprises a head capable of aligning multiple orifices, and multiple charge coupled device (CCD) cameras controlling the head so that each orifice is properly positioned on grids drawn adaptively according to pixel pitches of a pattern of the display panel substrate. Printing is then performed using the head.

A CCD camera may be provided on a lower side of a stage that supports a transparent display panel substrate. With this CCD camera, the display panel substrate may be photographed from underneath, and positions of the orifices can be photographed through the transparent display panel substrate. Accordingly, while using images photographed by the CCD camera, the orifices may be aligned on the grid drawn adaptively according to the pixel pitches of the display panel substrate pattern.

However, because the conventional aligning apparatus for manufacturing the display panel is provided on the lower side of the stage supporting the display panel substrate, and the display panel substrate and the orifices are photographed through holes formed on the stage, camera mounting is difficult, and the structure of the aligning apparatus is complicated.

In addition, the conventional aligning apparatus for manufacturing the display panel photographs orifices through the transparent display panel substrate. In the course of transmitting images and photographing the transparent display panel substrate, the images of the orifices may be distorted due to refraction and the like, thus making it difficult to control the distortion of the images.

Further, the conventional aligning apparatus for manufacturing the display panel is typically only used for transparent display panel substrates, thus it can not be used with opaque substrates.

SUMMARY OF THE INVENTION

The present general inventive concept provides an aligning apparatus having a simple configuration that is capable of being easily installed and controlled precisely; and is capable of being used with opaque substrates.

Additional aspects and/or advantages of the present general inventive concept will be set forth in part in the description which follows and, in part, will be obvious from the description, or may be learned by practice of the present general inventive concept.

The foregoing and/or other aspects and advantages of the present general inventive concept are achieved by providing an apparatus to align a substrate and a print head having a plurality of orifices so as to perform a printing operation on the substrate, the apparatus comprising a camera unit provided between the substrate and the print head to photograph the plurality of orifices of the print head and the substrate so as to align the print head and the substrate, and a camera moving part to movably support the camera unit and to move the camera unit between the substrate and the print head.

The camera unit may comprise a first camera that photographs the print head and a second camera that photographs the substrate.

The camera unit may further comprise a prism that refracts images of the print head and the substrate toward the first and second cameras, respectively.

The camera unit may further comprise a lens that photographs and enlarges the images of the print head and the substrate.

The substrate includes a pixel grid on which a plurality of pixels are drawn in regular intervals for a display panel, and the camera unit photographs positions of the plurality of orifices of the print head relative to the plurality of pixels of the substrate to be printed on by the plurality of orifices.

The apparatus may further comprise a display part that displays the images photographed by the camera unit so as to align the plurality of orifices of the print head and the plurality of pixels on the substrate.

The apparatus may further comprise at least one of a head moving part to movably support the print head and a stage to movably support the substrate, and a control part to compare the images photographed by the camera unit and to control the at least one of the head moving part and the stage so that one of the print head and the stage is aligned with respect to the other.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
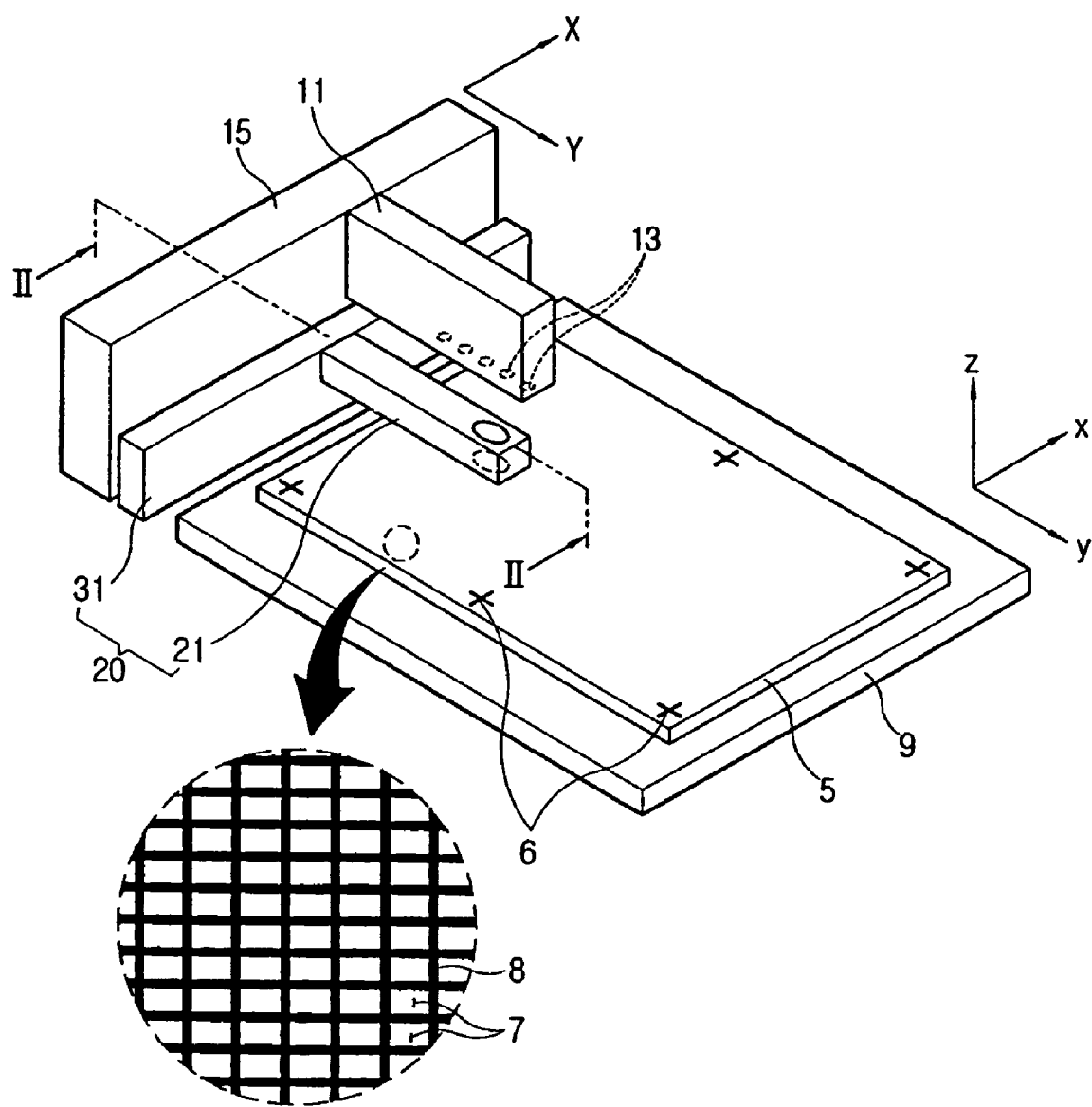
FIG. 1 is a perspective view illustrating a printing process using an aligning apparatus according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a perspective view illustrating a printing process using an aligning apparatus according to an embodiment of the present general inventive concept.

The printing process comprises a process of forming a color filter on a substrate 5 using an inkjet device. The substrate 5 is disposed on a stage 9 provided on a lower side of the substrate 5 to movably support the substrate 5. A print head 11 performs a printing operation on the substrate 5, and a head moving part 15 movably supports the print head 11. An aligning apparatus 20 aligns the substrate 5 and the print head 11.

The substrate 5 may be formed of a plate-shaped glass used in manufacturing display panels for flat display apparatuses, such as a TFT-LCD or an organic ELD. The substrate 5 is provided with a pixel grid 8 having a plurality of pixels 7 formed at regular intervals. During the printing process, each of the plurality of pixels 7 is filled with ink ejected from a plurality of orifices 13 of the print head to be described later. The substrate 5 may also be provided with a plurality of alignment marks 6 to be used as reference points to align a moving direction of the print head 11 and an arraying direction of the plurality of pixels 7 formed on the substrate 5. The substrate 5 may be transparent, semi-transparent, or opaque. The aligning apparatus 20 used to align the substrate 5 need not be used only for display panels, but may also be used for other purposes.

The stage 9 is plate-shaped and is provided on the lower side of the substrate 5 to support the substrate 5. The stage 9 movably supports the substrate 5 so that the substrate 5 is aligned with the print head 11. The stage 9 may movably support the substrate 5 in a planar direction and allow the alignment marks 6 of the substrate 5 with correspond to the moving direction of the print head 11. In other words, the stage 9 may be moved in two axial directions (x, y) perpendicular to each other in the planar direction of the substrate 5. The stage 9 may also be rotated about a transverse axial direction (z) of the planar direction of the substrate 5. Accordingly, the stage 9 supports the substrate 5 and moves the substrate 5 to allow the alignment marks 6 of the substrate 5 to correspond with the moving direction of the print head 11. Further, the two axial moving directions (x, y) of the stage 9 may be different from or the same as two axial moving directions (X, Y) of the print head 11 to be described later.

The print head 11 comprises the plurality of orifices 13 from which ink is ejected onto the plurality of pixels 7 of the substrate 5. In particular, the plurality of orifices 13 eject ink to form the color filter for a display panel. For example, the plurality of orifices 13 may eject R (red), G (green), and B (blue) ink to form the color filter of the display panel for a TFT-LCD. The print head 11 is supported by the head moving part 15 to be movable in the two axial directions (X, Y).

The head moving part 15 movably supports the print head 11. The head moving part 15 may movably support the print head 11 in the two axial directions (X, Y). The head moving part 15 may have an error of a moving distance less than approximately 10 micrometers (μm). Accordingly, the head moving part 15 moves the print head 11 along the arraying direction of the plurality of pixels 7 provided on the substrate 5. As illustrated in FIG. 1, the head moving part 15 is first moved in the X direction, thereby filling the plurality of pixels 7 with ink. Thereafter, the head moving part 15 is moved in the Y direction to fill the plurality of pixels 7 of another array and then in the X direction again (i.e., the converse direction), thereby filling the plurality of pixels 7 with ink.

Figure 2:
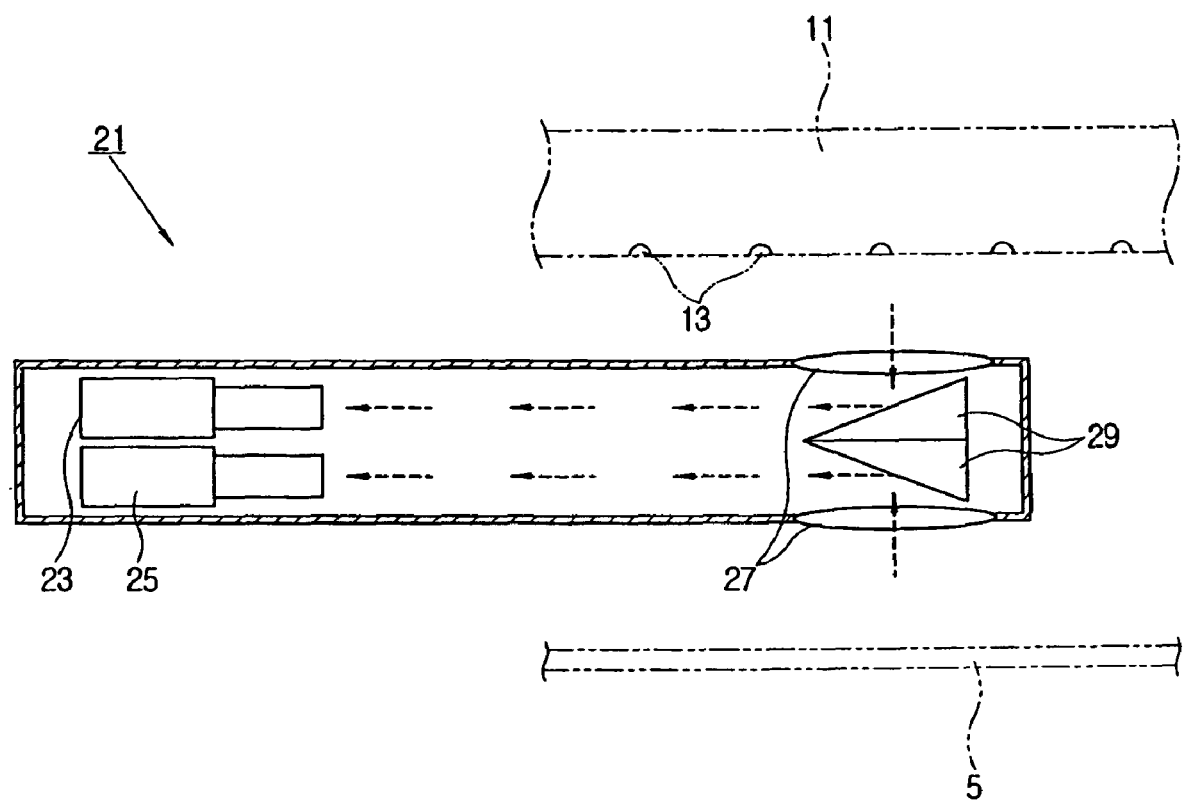
FIG. 2 is a schematic sectional view taken along line II-II of a camera unit of the aligning apparatus of FIG. 1.
Figure 3:
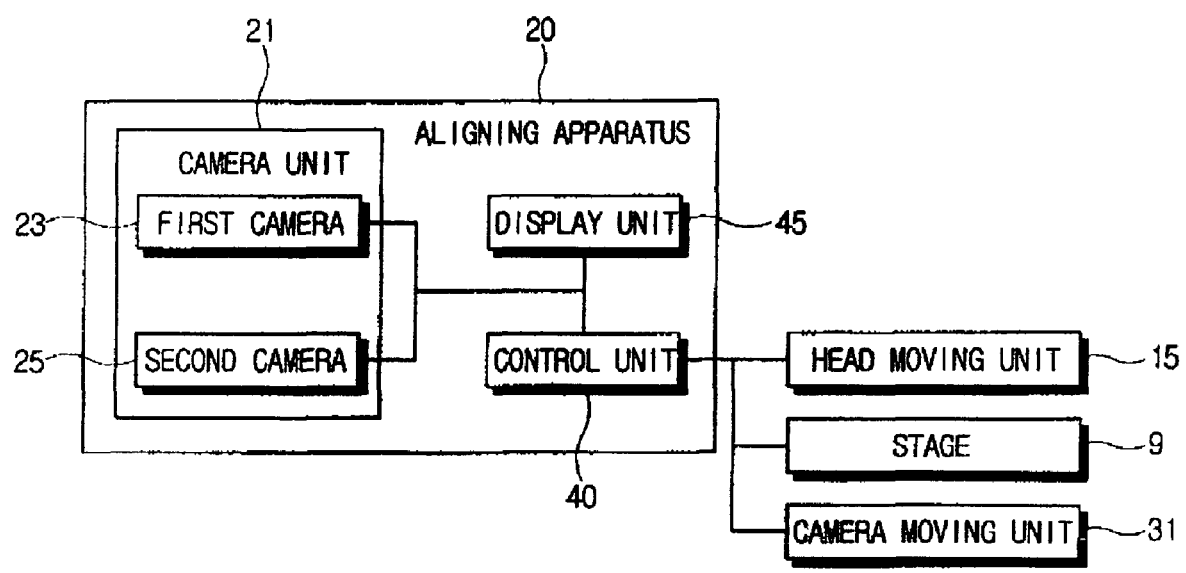
FIG. 3 is a control block diagram of the aligning apparatus of FIG. 1 according to the present general inventive concept.

As illustrated in FIGS. 1 to 3, the aligning apparatus 20 according to the present general inventive concept comprises a camera unit 21 provided between the substrate 5 and the print head 11 to photograph the plurality of orifices 13 of the print head 11 and the substrate 5, and a camera moving part 31 to movably support the camera unit 21 between the substrate 5 and the print head 11. The aligning apparatus further comprises a display part 45 to display images photographed by the camera unit 21. The aligning apparatus further comprises a control part 40 to compare the images photographed by the camera unit 21 and to control the print head 11 and the substrate 5 to be aligned according to the result of the comparison.

The camera unit 21 is movable between the substrate 5 and the print head 11 and photographs the plurality of orifices 13 of the print head 11 and the pixel grid 8 of the substrate 5. The camera unit 21 photographs an arbitrary one of the plurality of orifices 13 of the print head 11 and a corresponding one of the plurality of pixels 7 of the substrate 5 to be printed on by the arbitrary one of the plurality of orifices 13. The camera unit 21 may comprise a first camera 23 that photographs the print head 11 and a second camera 25 that photographs the substrate 5. The camera unit 21 may further comprise a prism 29 that refracts (and/or reflects) images of the print head 11 and the substrate 5 toward the first camera 23 and the second camera 25. The camera unit 21 may further comprise lenses 27 to enlarge and photograph the images of the print head 11 and the substrate 5. Alternatively, the camera unit 21 may be provided with a single camera (not shown) in lieu of both the first camera 23 and the second camera 25, and may photograph the print head 11 and the substrate 5 sequentially. The single camera of the camera unit 21 may also simultaneously photograph the images of the print head 11 and the substrate 5 refracted (and/or reflected) by the prism 29. Accordingly, the plurality of orifices 13 of the print head 11 and the plurality of pixels 7 of the substrate 5 to be printed on by the plurality of orifices 13 are photographed by the camera unit 21. The image of the print head 11 is compared to the image of the substrate 5 to control positions of the plurality of orifices 13 with respect to the plurality of pixels 7 of the substrate 5.

As illustrated in FIG. 2, the first camera 23 photographs a lower area of the print head 11 on which the plurality of orifices 13 of the print head 11 are provided. The first camera 23 may be provided inside the camera unit 21 to photograph the image of the print head 11 refracted (and/or reflected) by the prism 29. Alternatively, the first camera 23 may be provided on an upper side of the camera unit 21 to photograph the print head 11 directly.

The second camera 25 photographs an upper area of the substrate 5 on which the plurality of pixels 7 are provided. The second camera 25 may be provided inside the camera unit 21 to photograph the image of the substrate 5 refracted (and/or reflected) by the prism 29. Alternatively, the second camera 25 may be provided on a lower side of the camera unit 21 to photograph the substrate 5 directly.

The prism 29 is provided on a distal end of the camera unit 21 to refract (and/or reflect) the images of the print head 11 and the substrate 5 toward the first camera 23 and the second camera 25, respectively. Accordingly, with the prism 29, the first camera 23 and the second camera 25 may be mounted in various positions, for example, in an internal area of the camera unit 21.

The lenses 27 may be provided on the upper and the lower sides of the distal end of the camera unit 21 to enlarge the images of the print head 11 and the substrate 5, respectively. The lenses 27 may also be provided between the first and the second cameras 23 and 25 and the prism 29 to enlarge the images of the print head 11 and the substrate 5. Accordingly, by providing the lenses 27 on the camera unit 21, the images of the print head 11 and the substrate 5 may be enlarged and photographed.

Figure 4:
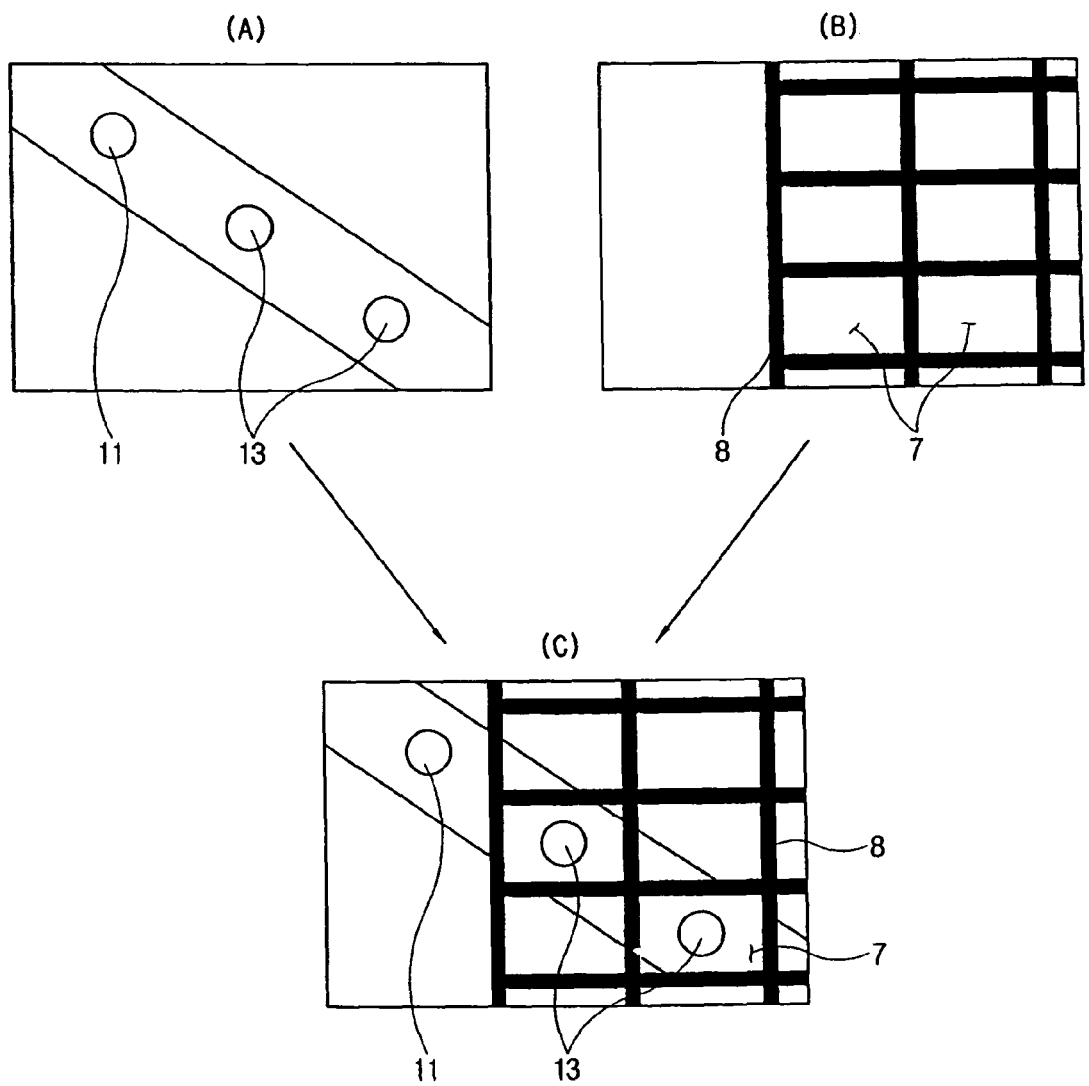
FIG. 4 is a view illustrating images produced by the aligning apparatus of FIG. 1.

The display part 45 is connected to the camera unit 21 to display images photographed by the camera unit 21. As illustrated in FIG. 4, the display part 45 displays a combination image (C) by combining an image (A) of the print head 11 photographed by the first camera 23 and an image (B) of the substrate 5 photographed by the second camera 25. That is, the display part 45 can ascertain whether the plurality of orifices 13 of the print head 11 are properly positioned with respect to the plurality of pixels 7 of the substrate 5 using the combination image (C) displayed by combining the image (A) and the image (B), simultaneously. Accordingly, a user may compare the image (A) with the image (B) through the combination image (C) and control the head moving part 15 so that the plurality of orifices 13 of the print head 11 are properly positioned on the corresponding plurality of pixels 7 of the substrate 5. The user may also control the stage 9 so that the plurality of orifices 13 of the print head 11 are properly positioned with respect to the corresponding plurality of pixels 7 of the substrate 5. The display part may also display more than one combination image by combining more than one image of the print head 11 and the substrate 5.

The control part 40 is connected to the camera unit 21 to receive images photographed by the camera unit 21 and to compare the received images and align the print head 11 and the substrate 5. In particular, the control part 40 senses positions of the plurality of orifices 13 of the print head 11 with respect to positions of the plurality of pixels 7 of the substrate 5 from the received images. The control part 40 controls the head moving part 15 so that the sensed positions of the plurality of orifices 13 and the plurality of pixels 7 correspond with each other and are properly positioned. However, the control part 40 may also control the stage 9 so that the sensed positions of the plurality of orifices 13 and the plurality of pixels 7 correspond with each other. Further, the control part 40 controls the camera moving part 31 to allow the camera unit 21 to recognize the alignment marks 6 of the substrate 5 and to ascertain whether the recognized alignment marks 6 are to be aligned in the moving direction of the print head 11. The control part 40 may also control the stage 9 so that the alignment marks 6 of the substrate 5 are aligned in the moving direction of the print head 11.

The camera moving part 31 movably supports the camera unit 21. The camera moving part 31 may movably support the camera unit 21 in the two axial directions (X, Y), like the head moving part 15, and may be provided with a linear motion (LM) guide (not shown) for precise control. Accordingly, the camera moving part 31 may move the camera unit 21 between the print head 11 and the substrate 5, and move it outside of the substrate 5 while the print head 11 is performing the printing operation.

With this configuration, the aligning apparatus 20 according to the present general inventive concept operates as follows. The substrate 5 is positioned on the stage 9, and it is ascertained whether the substrate 5 is properly positioned on the stage 9. In other words, the position of the substrate 5 on the stage 9 is controlled so that the alignment marks 6 of the substrate 5 correspond with the moving direction of the print head 11 when the printing operation is performed. In this case, the alignment marks 6 are ascertained by the camera unit 21 by controlling the camera moving part 31. The alignment marks 6 of the substrate 5 can be ascertained to correspond with the moving direction of the print head 11, because the moving direction of the camera moving part 31 corresponds with that of the print head 11. When the alignment marks 6 do not correspond with the moving direction of the print head 11, the stage 9 may be controlled to allow the alignment marks 6 to correspond with the moving direction of the print head 11. However, by attaching a separate camera (not shown) on the print head 11, it may be ascertained whether the alignment marks 6 of the substrate 5 correspond with the moving direction of the print head 11. In addition, after moving the print head 11 above the upper side of the substrate 5 using the head moving part 15, the camera unit 21 can be moved between the print head 11 and the substrate 5 by the camera moving part 31. Thereafter, the images of the print head 11 and the substrate 5 can be photographed by the camera unit 21, and the head moving part 15 is controlled by at least one of the display part 45 and the control part 40 so that the plurality of orifices 13 of the print head 11 are properly positioned on the plurality of pixels 7 of the substrate 5. The printing operation may be performed by the print head 11 after withdrawing the camera unit 21 away from the surface area of the substrate 5 to be printed on. By establishing positions of the print head 11 and the substrate 5 before the printing operation starts, the established positions may be used as a reference point during the printing operation to align other pixels 7 of the substrate 5. The established positions of the print head 11 and the substrate 5 may also be used in printing operations of other substrates 5.

As described above, the aligning apparatus 20 according to the present general inventive concept comprises the camera unit 21 provided between the substrate 5 and the print head 11, and the camera moving part 31 to move the camera unit 21 so that the aligning apparatus 20 is capable of inspecting the positions of the print head 11 and the substrate 5 in real time. Further, by disposing the camera unit 21 between the substrate 5 and the print head 11, the aligning apparatus 20 may have a simplified structure and an easy installation, and may also be used to precisely control alignment of an opaque substrate.

Although the present general inventive concept has been described in connection with the exemplary embodiments illustrated in the accompanying drawings, it should be understood that the present general inventive concept is not limited thereto, and those skilled in the art can make various modifications and changes without departing from the scope of the general inventive concept.

What is claimed is:

1. An apparatus to align a substrate and a print head having a plurality of orifices to perform a printing operation by ejecting ink on the substrate, comprising:
    a camera unit provided between both the substrate and the print head at the same time to photograph the plurality of orifices of the print head and of the substrate to align the print head and the substrate, such that a line perpendicular to an upper surface of the substrate passes through each of the substrate, the camera unit, and the print head at the same time; and
    a camera moving unit to movably support the camera unit and to move the camera unit between the substrate and the print head.

2. The apparatus as claimed in claim 1, wherein the camera unit comprises a first camera that photographs the print head and a second camera that photographs the substrate.

3. The apparatus as claimed in claim 2, wherein the camera unit further comprises a prism that refracts images of the print head and the substrate toward the first and second cameras, respectively.

4. The apparatus as claimed in claim 3, wherein the camera unit further comprises one or more lenses to photograph and enlarge the images of the print head and the substrate.

5. The apparatus as claimed in claim 1, wherein the substrate includes a pixel grid on which a plurality of pixels are drawn in regular intervals for a display panel, and the camera unit photographs the plurality of orifices of the print head relative to the plurality of pixels of the substrate to be printed on by the plurality of orifices.

6. The apparatus as claimed in claim 5, further comprising:
    a display unit that displays images photographed by the camera unit to align the plurality of orifices of the print head and the plurality of pixels of the substrate.

7. The apparatus as claimed in claim 5, further comprising:
    at least one of a head moving unit to movably support the print head and a stage to movably support the substrate, and
    a control unit to compare images photographed by the camera unit and to control the at least one of the head moving unit and the stage to be aligned with respect to the other.

8. The apparatus according to claim 6, further comprising:
    at least one of a head moving unit to movably support the print head and a stage to movably support the substrate, and
    a control unit to compare the images photographed by the camera unit and to control the at least one of the head moving unit and the stage to be aligned with respect to the other.

9. An apparatus to align a substrate having a plurality of pixels thereon with a print head having a plurality of orifices to eject ink onto the plurality of pixels, the apparatus comprising:
    a substrate supporting member;
    a print head moving unit to movably support the print head above an upper surface of the substrate; and
    a camera unit movable between both the upper surface of the substrate and a lower surface of the print head at the same time to receive images of the upper surface of the substrate and of the lower surface of the print head to align the substrate with the print head, such that a line perpendicular to an upper surface of the substrate passes through each of the substrate, the camera unit, and the print head at the same time.

10. The apparatus according to claim 9, wherein the substrate supporting member is movable in a first direction X and a second direction Y perpendicular to the first direction X.

11. The apparatus according to claim 9, wherein the substrate supporting member is rotatable about a Z axis perpendicular to a surface of the substrate supporting member.

12. The apparatus according to claim 9, wherein the print head moving unit is movable in an X direction and a Y direction perpendicular to the X direction.

13. The apparatus according to claim 9, wherein the camera unit comprises a first camera to receive the image of the lower surface of the print head and a second camera to receive the image of the upper surface of the substrate.

14. The apparatus according to claim 13, wherein the camera unit is connected to a camera moving unit at a proximal end of the camera unit and the first and second cameras are disposed at a distal end of the camera unit to directly photograph the lower surface of the print head and the upper surface of the substrate, respectively.

15. The apparatus according to claim 13, wherein the first camera and the second camera receive the images of the lower surface of the print head and the upper surface of the substrate simultaneously.

16. The apparatus according to claim 13, wherein the camera unit is connected to a camera moving unit at a proximal end of the camera unit and the first and second cameras are disposed inside the camera unit at the proximal end thereof.

17. The apparatus according to claim 16, wherein the camera unit further comprises a prism unit disposed inside the camera unit at a distal end thereof to reflect the images of the lower surface of the print head and the upper surface of the substrate toward the first and second cameras.

18. The apparatus according to claim 17, wherein the prism unit comprises a combination of prisms.

19. The apparatus according to claim 17, wherein the camera unit further comprises a first lens and a second lens disposed on a surface of the camera unit at the distal end thereof to enlarge the images of the lower surface of the print head and the upper surface of the substrate, respectively, and to provide the enlarged images of the lower surface of the print head and the upper surface of the substrate to the prism unit.

20. The apparatus according to claim 17, wherein the camera unit further comprises at least one lens disposed between the first and second cameras and the prism unit and to enlarge the images reflected by the prism unit.

21. The apparatus according to claim 9, further comprising:
    a display unit to receive the images of the lower surface of the print head and the upper surface of the substrate from the camera unit and to display the received images.

22. The apparatus according to claim 21, wherein the display unit combines the received images of the lower surface of the print head and the upper surface of the substrate to produce a combination image that depicts relative positions of one or more of the orifices on the lower surface of the print head and one or more corresponding pixels on the upper surface of the substrate.

23. The apparatus according to claim 21, further comprising:
    a control unit to control movement of at least one of the substrate supporting member and the print head moving unit according to the images of the lower surface of the print head and the upper surface of the substrate received by the display unit.

24. The apparatus according to claim 23, wherein the control unit senses a position of one or more of the orifices of the print head with respect to a position of one or more corresponding pixels of the substrate and moves at least one of the substrate supporting member and the print head moving unit to position the one or more of the orifices directly above the one or more corresponding pixels.

25. The apparatus according to claim 21, further comprising:
a control unit to enable a user to control movement of at least one of the substrate supporting member and the print head moving unit according to the images of the lower surface of the print head and the upper surface of the substrate displayed by the display unit.

26. The apparatus according to claim 9, wherein the image of the lower surface of the print head comprises an image of one or more of the orifices and the image of the upper surface of the substrate comprises an image of one or more corresponding pixels.

27. The apparatus according to claim 9, wherein the camera unit comprises a camera to sequentially photograph the lower surface of the print head and the upper surface of the substrate.

28. The apparatus according to claim 9, wherein the print head is capable of moving in one or more moving directions corresponding with alignment marks provided on the substrate.

29. The apparatus according to claim 28, further comprising:
a control unit to control movement of the substrate supporting member and the print head moving unit and to compare the images of the lower surface of the print head and the upper surface of the substrate,
wherein the control unit determines whether the substrate is properly positioned on the substrate supporting member based on the alignment marks, and if the substrate is not properly positioned on the substrate supporting member, the control unit causes the substrate supporting member to move the substrate so that the substrate is properly positioned with respect to the one or more moving directions of the print head.

30. The apparatus according to claim 9, wherein the substrate comprises one of a transparent substrate and a semi-transparent substrate.

31. The apparatus according to claim 9, wherein the substrate comprises an opaque substrate.

32. The apparatus according to claim 9, wherein the camera unit is movably supported by a camera moving unit to move the camera unit above the substrate during an alignment operation and to move the camera unit outside the substrate during a printing operation.

33. The apparatus according to claim 9, wherein the substrate comprises a display panel substrate.

34. The apparatus according to claim 33, wherein the display panel substrate comprises one of a thin film transistor-liquid display and an organic electro luminescence display.

35. An alignment apparatus to align a print head to a substrate, the alignment apparatus comprising:
a camera unit disposed between both the print head and the substrate at the same time to photograph the print head and the substrate, such that a line perpendicular to an upper surface of the substrate passes through each of the substrate, the camera unit, and the print head at the same time; and
a camera moving unit to move the camera unit with respect to the substrate and the print head to align a plurality of orifices of the print head to a pixel grid of the substrate according to the photographs.

* * * * *